(12) United States Patent
Liskow

(10) Patent No.: US 10,721,819 B2
(45) Date of Patent: Jul. 21, 2020

(54) ELECTRONIC MODULE HAVING CIRCUIT BOARDS AND A PLASTIC SEALING RING THAT CAN BE MOLDED ON BY INJECTION MOLDING, IN PARTICULAR FOR A MOTOR VEHICLE TRANSMISSION CONTROL UNIT, AND METHOD FOR PRODUCING SAID ELECTRONIC MODULE

(71) Applicant: Robert Bosch GmbH, Stuttgart (DE)

(72) Inventor: Uwe Liskow, Asperg (DE)

(73) Assignee: Robert Bosch GmbH, Stuttgart (DE)

( * ) Notice: Subject to any disclaimer, the term of this patent is extended or adjusted under 35 U.S.C. 154(b) by 581 days.

(21) Appl. No.: 14/908,070

(22) PCT Filed: Jul. 24, 2014

(86) PCT No.: PCT/EP2014/065872
§ 371 (c)(1),
(2) Date: Jan. 27, 2016

(87) PCT Pub. No.: WO2015/014697
PCT Pub. Date: Feb. 5, 2015

(65) Prior Publication Data
US 2016/0165727 A1    Jun. 9, 2016

(30) Foreign Application Priority Data

Aug. 2, 2013  (DE) .................. 10 2013 215 246

(51) Int. Cl.
*H05K 3/30*    (2006.01)
*H05K 3/28*    (2006.01)
(Continued)

(52) U.S. Cl.
CPC ............. *H05K 1/144* (2013.01); *B29C 39/10* (2013.01); *B29C 45/14311* (2013.01);
(Continued)

(58) Field of Classification Search
CPC ............ H05K 3/284; H05K 3/28; H05K 5/00; H05K 5/06; H05K 1/14; H05K 3/305;
(Continued)

(56) References Cited

U.S. PATENT DOCUMENTS 4,965,227 A * 10/1990 Chang .................. H01L 21/486
                                                     174/50.51
5,134,546 A    7/1992 Izumi et al.
(Continued)

FOREIGN PATENT DOCUMENTS

CN    101939227 A    1/2011
CN    103229607 A    7/2013
(Continued)

OTHER PUBLICATIONS

International Search Report corresponding to PCT Application No. PCT/EP2014/065872, dated Jan. 5, 2015 (German and English language document) (5 pages).

*Primary Examiner* — Peter Dungba Vo
*Assistant Examiner* — Kaying Kue
(74) *Attorney, Agent, or Firm* — Maginot, Moore & Beck LLP

(57) ABSTRACT

An electronic module has a first circuit board element, a second circuit board element, and a spacer. Together, the first circuit board element, the second circuit board element, and the spacer enclose a central cavity, in which components attached to the first circuit board element are accommodated. Respective annular circumferential microstructures are provided on a surface of the first circuit board element directed outward and on a surface of the second circuit board element directed outward, adjacent to an outer periphery of the first circuit board element. In this region, a sealing ring is formed, which has a form-closed connection to both the first and the second circuit board element by means of the microstructures of the first and the second circuit board (Continued)

element. The sealing ring can be made of a resistant plastic, which is molded on by injection molding in the liquid state in the region of the outer periphery of the first circuit board element and flows into recesses of the microstructures and, after the curing, forms the form-closed and sealing connection between the two circuit board elements and the sealing ring thereby formed.

4 Claims, 2 Drawing Sheets

(51) Int. Cl.
| | |
|---|---|
| H05K 1/14 | (2006.01) |
| H05K 5/06 | (2006.01) |
| B29C 45/14 | (2006.01) |
| H05K 5/00 | (2006.01) |
| B29C 65/54 | (2006.01) |
| B29C 39/10 | (2006.01) |
| H05K 1/18 | (2006.01) |
| H05K 3/00 | (2006.01) |
| H05K 3/36 | (2006.01) |
| B29C 65/00 | (2006.01) |
| B29L 31/34 | (2006.01) |
| B29C 65/70 | (2006.01) |
| B29L 31/00 | (2006.01) |

(52) U.S. Cl.
CPC ...... *B29C 45/14467* (2013.01); *B29C 65/542* (2013.01); *H05K 1/141* (2013.01); *H05K 1/18* (2013.01); *H05K 3/0044* (2013.01); *H05K 3/368* (2013.01); *H05K 5/0043* (2013.01); *H05K 5/0082* (2013.01); *H05K 5/065* (2013.01); *B29C 45/14508* (2013.01); *B29C 65/70* (2013.01); *B29C 66/0246* (2013.01); *B29C 66/02245* (2013.01); *B29C 66/112* (2013.01); *B29C 66/114* (2013.01); *B29C 66/30322* (2013.01); *B29C 66/53462* (2013.01); *B29C 66/71* (2013.01); *B29C 66/7394* (2013.01); *B29C 66/73161* (2013.01); *B29C 66/73941* (2013.01); *B29L 2031/3425* (2013.01); *B29L 2031/3481* (2013.01); *B29L 2031/7172* (2013.01); *H05K 3/284* (2013.01); *H05K 2201/042* (2013.01); *H05K 2201/09063* (2013.01); *H05K 2201/1059* (2013.01); *H05K 2201/10295* (2013.01); *H05K 2201/2018* (2013.01); *H05K 2201/2036* (2013.01); *H05K 2201/2072* (2013.01); *H05K 2203/1147* (2013.01); *H05K 2203/1327* (2013.01)

(58) Field of Classification Search
CPC ............ H05K 3/303; H05K 3/30–3494; Y10T 29/49146; Y10T 29/4913; B29C 45/14
See application file for complete search history.

(56) References Cited

U.S. PATENT DOCUMENTS

| | | | | |
|---|---|---|---|---|
| 5,639,990 | A * | 6/1997 | Nishihara | H01L 23/043 174/260 |
| 6,221,696 | B1 * | 4/2001 | Crema | H01L 21/4821 438/118 |
| 6,831,372 | B2 * | 12/2004 | Ruhland | H01L 23/3107 257/666 |
| 7,205,180 | B1 * | 4/2007 | Sirinorakul | H01L 24/49 438/123 |
| 7,504,712 | B2 * | 3/2009 | Martin | H01L 23/3107 257/666 |
| 8,420,446 | B2 * | 4/2013 | Yo | C25D 5/12 257/E21.505 |
| 8,698,326 | B2 * | 4/2014 | Huang | H01L 23/3128 257/787 |
| 8,739,401 | B2 * | 6/2014 | Shimazaki | H01L 21/561 29/846 |
| 8,895,366 | B2 * | 11/2014 | Huang | H01L 23/3128 438/118 |
| 9,101,050 | B2 * | 8/2015 | Shimamura | H05K 1/0216 |
| 9,253,886 | B2 * | 2/2016 | Lee | B81B 7/0058 |
| 9,781,833 | B2 * | 10/2017 | Bedjaoui | H01L 23/04 |
| 9,793,194 | B2 * | 10/2017 | Hayashi | H01L 23/49506 |
| 2002/0153596 | A1 * | 10/2002 | Tsubosaki | H01L 24/29 257/666 |
| 2004/0041496 | A1 * | 3/2004 | Imai | H03H 3/10 310/313 D |
| 2004/0100164 | A1 * | 5/2004 | Murata | H01L 24/97 310/348 |
| 2004/0188699 | A1 * | 9/2004 | Kameyama | H01L 24/03 257/99 |
| 2004/0232534 | A1 * | 11/2004 | Seki | C25D 5/02 257/678 |
| 2005/0034888 | A1 * | 2/2005 | Hoffmann | H01L 24/31 174/558 |
| 2006/0097366 | A1 * | 5/2006 | Sirinorakul | H01L 23/495 257/666 |
| 2007/0262462 | A1 * | 11/2007 | Shimizu | H01L 21/561 257/773 |
| 2008/0061451 | A1 * | 3/2008 | Huang | H01L 23/3128 257/787 |
| 2008/0170372 | A1 | 7/2008 | Kirigaya | |
| 2009/0039486 | A1 * | 2/2009 | Shimazaki | H01L 21/561 257/676 |
| 2009/0053850 | A1 * | 2/2009 | Nishida | H01L 27/14618 438/64 |
| 2009/0071710 | A1 * | 3/2009 | Stelzl | H01L 23/3164 174/520 |
| 2009/0124965 | A1 * | 5/2009 | Greenberg | A61N 1/0531 604/67 |
| 2009/0133904 | A1 * | 5/2009 | Koga | H05K 3/0052 174/251 |
| 2010/0006884 | A1 * | 1/2010 | Ou | H01L 33/40 257/98 |
| 2013/0176686 | A1 * | 7/2013 | Lee | B81B 7/0058 361/728 |
| 2015/0049439 | A1 * | 2/2015 | Shimamura | H05K 1/0216 361/728 |

FOREIGN PATENT DOCUMENTS

| | | |
|---|---|---|
| DE | 39 42 392 A1 | 6/1990 |
| DE | 10 2004 021 931 A1 | 10/2005 |
| DE | 10 2009 053 512 A1 | 5/2011 |
| DE | 10 2010 008 074 A1 | 8/2011 |
| EP | 2 163 145 A1 | 3/2010 |
| EP | 2 305 013 A1 | 4/2011 |

\* cited by examiner

ELECTRONIC MODULE HAVING CIRCUIT BOARDS AND A PLASTIC SEALING RING THAT CAN BE MOLDED ON BY INJECTION MOLDING, IN PARTICULAR FOR A MOTOR VEHICLE TRANSMISSION CONTROL UNIT, AND METHOD FOR PRODUCING SAID ELECTRONIC MODULE

Electronic module having circuit boards and a plastic sealing ring that can be molded on by injection molding, in particular for a motor vehicle transmission control unit, and method for producing said electronic module

FIELD OF THE INVENTION

The present invention relates to an electronic module, such as may be used in particular for a motor vehicle transmission control unit. The invention furthermore relates to a method for producing such an electronic module.

PRIOR ART

Control devices, for example transmission control units (TCUs), engine control devices, battery control devices, etc. in a motor vehicle, which contain electronic components, should generally be protected in a hermetically sealed fashion against surrounding media. In the case of applications in motor vehicles, such control devices are exposed, for example, to aggressive media such as transmission oil, engine oil, water, urea/water solutions, brake fluid, etc. Added to this, particularly when used in motor vehicles, control devices may be exposed to further potentially damaging effects, for example large temperature variations, mechanical vibration loading, etc.

In order to be able to protect the electronic components of motor vehicle control devices from damaging effects, in particular due to surrounding media, they have in the past usually been contained in elaborately configured hermetically sealed housings. The housings in this case usually consist of sheet metal, in which case, for example, electrical leads to be fed through a housing wall need to be elaborately electrically insulated. Outlay for production of the housing and for the electrical insulation of the leads may be significant.

Simpler, more economical technical solutions have so far often not proven reliable in the long term. For example, it has been observed that seals in the form of elastomer rings, which have been used for hermetically sealing complementary parts of a plastic housing, cannot withstand the robust ambient conditions occurring in motor vehicle applications, in particular the aggressive surrounding media, in the long term, for example for more than ten years. In order to additionally protect the electronic components contained in the housing from media possibly entering, they are often enclosed with a protective gel, although this entails additional outlay and costs.

Alternative solutions, in which a plastic is molded around a so-called lead frame, require for example expensive injection-molding tools.

DE 10 2004 021 931 A1 describes a housing for an electronic circuit.

DISCLOSURE OF THE INVENTION

With embodiments of the present invention, an electronic module and a method for producing such an electronic module are described, with the aid of which simple and economical producibility can be combined with long and reliable durability of electronic modules, in particular for motor vehicle construction. In particular, an advantageous electronic module and a method for its production are described, with which electronic components that are contained in the electronic module are reliably protected in the long term in a hermetically sealed fashion from aggressive surrounding media.

According to a first aspect of the present invention, an electronic module is provided, which has a first and a second circuit board element as well as a spacer. The first circuit board element is provided with at least one electronic component arranged thereon, for example an electronic control circuit. The second circuit board element is provided with at least one electrical component arranged thereon, for example a jack connection, a sensor, etc. The first circuit board element, the second circuit board element and the spacer are configured in a complimentary fashion to one another, in such a way that together they fully enclose a central cavity in which the electronic component of the first circuit board element is received. The electronic module is distinguished in that microstructuring in each case extending around in the shape of a ring is formed both on an outwardly directed surface of the first circuit board element, on an outer circumference of the first circuit board element, and on an outwardly directed surface of the second circuit board element, next to the outer circumference of the first circuit board element. Furthermore, a sealing ring, which is both connected with a form fit to the microstructuring formed on the first circuit board element and is connected with a form fit to the microstructuring formed on the second circuit board element, is formed along the outer circumference of the first circuit board element.

According to a second aspect of the present invention, a method for producing an electronic module is described, in particular an electronic module according to the first aspect of the present invention above. In this case, the first and the second circuit board element as well as the spacer are first provided. Then, microstructuring extending around in the shape of a ring is formed both on an outwardly directed surface of the first circuit board element, on an outer circumference of the first circuit board element, and on an outwardly directed surface of the second circuit board element, next to the outer circumference of the first circuit board element. Subsequently, at least one electronic component is arranged on a surface of the first circuit board element facing toward the central cavity, which is enclosed by the two circuit board elements and the spacer. A sealing ring is then formed along the outer circumference of the first circuit board element, such that the sealing ring is both connected with a form fit to the microstructuring formed on the first circuit board element and is connected with a form fit to the microstructuring formed on the second circuit board element.

Ideas for embodiments of the present invention may, inter alia, be regarded as based on the concepts and discoveries described below.

Previous technical solutions for hermetically sealed encapsulation of electronic components in an electronic module with the aid of a separately provided housing have been recognized to be cost-intensive and elaborate in terms of production. Injection molding around, for example, lead frames provided with electronic components by means of plastic injection molding is also cost-intensive because of the expensive injection molding tools required therefor. Technically simpler solutions with housing parts consisting e.g. of plastic and conventional sealing rings arranged between such housing parts do not seem capable of sealing reliably in the long term, so that protection of the electronic components by additional measures, for example filling regions around the components with a chemically resistant gel, seem necessary.

It has now been discovered that an electronic module can be formed with the aid of two circuit board elements, for example printed circuit boards (PCBs), preferably arranged parallel next to one another. The two circuit board elements are separated from one another by a spacer arranged between them. Together with the spacer, the two circuit board elements enclose a central cavity in which electronic components, for example a transmission control unit, can be received. In order to be able to reliably hermetically seal a region between the two circuit board elements, i.e. adjacent to the spacer, a sealing ring is formed in this region.

In this case, account is taken of the fact that thermosetting materials typically used for circuit board elements, for example epoxides, generally cannot be connected, or can be connected at best poorly, to other materials with the aid of adhesives or the like. Instead of a merely adhesively bonding force-fit connection, it is therefore proposed to form a form-fit connection between the sealing ring and both the first and the second circuit board element. In order to be able to form such a form-fit connection, on the one hand microstructuring is formed on an outwardly directed surface of the first circuit board element, in a region adjacent to its outer circumference. On the other hand, microstructuring is also formed on the second circuit board element on an outwardly directed surface.

Such microstructuring may in this case be understood as a three-dimensional structure with, for example, at least in part outwardly open cavities, indentations and/or undercuts with structure sizes in the nanometer range, for example structure sizes in the range from 10 to 100 nanometers.

The sealing ring may be configured in such a way that at least near-surface regions of the sealing ring engage in the microstructuring on the first or second circuit board element, so as to produce the desired form-fit connection between the sealing ring and these circuit board elements. Such a connection, configured not only with a force fit but also with a form fit, between the sealing ring on the one hand and the two circuit board elements on the other hand can ensure that the sealing ring reliably fixes the cover element on the circuit board element in the long term and an interface between the two elements can be hermetically sealed.

The sealing ring may be formed by molding or injection molding a plastic material onto the surfaces, provided with the microstructuring, of the circuit board elements. During the production of the electronic module, the sealing ring may in this case be formed by molding or injection molding on an initially liquid plastic material, which can flow into the cavities or undercuts of the microstructurings and can subsequently cure. In this way, the desired form-fit connection can be produced in a simple way.

For example, the sealing ring may be made of a plastic, for example thermoplastics (such as polyamide, PA 6, PA 66), thermosets (for example epoxy resins filled with silicon dioxide), etc., an encapsulation compound, for example silicone or epoxy resin compounds, etc., and/or an adhesive, for example based on epoxide. In particular, a plastic which can be processed in liquid form and can then be cured may be used for the sealing ring. Such materials are on the one hand relatively easy to process and economical, but on the other hand they may lead to a long-term hermetic seal as well as sufficient resistance to aggressive media.

The sealing ring may be formed by various methods. For example, the sealing ring may be formed by thermoplastic injection molding, i.e. by injection-molding on a thermoplastic plastic. As an alternative, the sealing ring may be formed by thermoset molding, i.e. by molding on a thermosetting plastic, for example without pressure or with pressure, as for example in the case of transfer molding. As further alternatives, an encapsulation compound may be introduced into an intermediate space provided therefor between the circuit board element and the cover element, and subsequently cured. Adhesive bonding of the circuit board element to the cover element by means of a suitable adhesive, which may for example be based on silicone, epoxy resin, PUR/EP, or the like, may also be envisioned.

The circuit board elements may be configured as commercially available circuit boards, for example consisting of thermosetting plastic, for example glass fiber-reinforced epoxy resin. Such thermosetting materials are often used as a carrier material for circuit boards and may, in particular, have advantageous properties which make them seem suitable for use in electronic modules for motor vehicles. In particular, thermosetting plastics may be chemically stable and resistant to aggressive media and withstand high temperatures as well as large temperature variations.

The spacer may likewise consist of plastic, for example thermoplastic, thermoset or the like. It may be formed as a simple injection-molded part. The spacer has an annular configuration so that it can enclose the intermediate space formed between the two circuit board elements to be separated, at the edges of this intermediate space, so as to fully encapsulate the central cavity intended to receive the electronic components.

The microstructuring intended to achieve the desired form-fit connection with the sealing ring to the two circuit board elements may be formed by various methods.

For example, microstructuring may be formed by laser structuring techniques. In this case, a laser beam is directed onto the surfaces to be structured. By absorption thereof, the material present there can be heated strongly and ultimately vaporized at least locally. By suitable local irradiation of the surfaces to be structured, the desired indentations, cavities and/or undercuts for the microstructuring can therefore be formed. For the laser structuring, low-power lasers with a laser power of up to 100 watts may for example be used, such as are also used as marking lasers, but also ultrashort-pulse lasers.

As an alternative, the microstructuring may also be produced by chemical roughening, mechanical roughening and/or plasma roughening, that is to say by exposing the to be structured to a high-energy plasma. To this end, a commercially available plasma cleaning system may be used, which operates for example with water, hydrogen, oxygen, hydrogen peroxide or ambient air.

In the proposed electronic module, it may in particular be advantageous to configure the sealing ring in such a way that it is exposed outward. Such an outwardly exposed sealing ring may, after the two circuit board elements and the spacer have been correspondingly arranged, be molded on simply from the outside, for example injection-molded on. The microstructurings on the circuit board elements are in this case also outwardly exposed before the sealing ring is formed, i.e. they are arranged outside the central cavity.

According to one embodiment the first circuit board element may have first electrical terminals, which are electrically connected to the at least one electronic component, and the second circuit board element may have second electrical terminals, which are electrically connected to the at least one electrical component. The first electrical terminals may in this case be electrically connected to the second electrical terminals via lines. In this way, the electronic components provided on the first circuit board element can be interconnected with the electrical components provided on the second circuit board element.

In particular, the first electrical terminals may be electrically connected to the second electrical terminals inside the central cavity by means of press-fit connections and/or spring contacts. The press-fit connections or spring contacts used as a connecting electrical line are therefore protected against attack by aggressive surrounding media.

As an alternative, the first electrical terminals may be electrically connected to the second electrical terminals outside the central cavity by means of electrical lines, which extend through the sealing ring. The lines may in this case be arranged between the first and the second circuit board element in the vicinity of the circumference of the first circuit board element, before the sealing ring is formed, for example by injection molding around this region. During the subsequent injection molding, the lines are then embedded in the still liquid material of the sealing ring.

It may be advantageous to equip one or both circuit board elements and/or the spacer with a metal layer as a diffusion barrier. It has been observed that the plastics which may be used for the circuit board elements or the spacer are not always fully leaktight in relation to aggressive media. In particular, some media can defuse through such plastics. An additional metal layer, produced for example by depositing metal on an inner or outer surface of the respective element, can prevent such diffusion through, and therefore improve a hermetic seal.

It is to be pointed out that possible features and advantages of embodiments of the invention are described sometimes in relation to an electronic module according to the invention, sometimes in relation to a transmission control unit according to the invention, and sometimes in relation to a method for producing an electronic module. A person skilled in the art will understand that the described features may be interchanged or combined in a suitable way, and in particular may be transferred from the electronic module in a similar way to the production method, or vice versa, so as to be able to obtain further embodiments, and possibly synergy effects.

BRIEF DESCRIPTION OF THE DRAWINGS

Embodiments of the present invention will be described below with reference to the appended drawings; neither the description nor the drawings are to be interpreted as restricting the invention.

The figures are merely schematic and not true to scale. References which are the same relate to features which are the same or have the same effect in the various figures.

EMBODIMENTS OF THE INVENTION

Figure 1A:
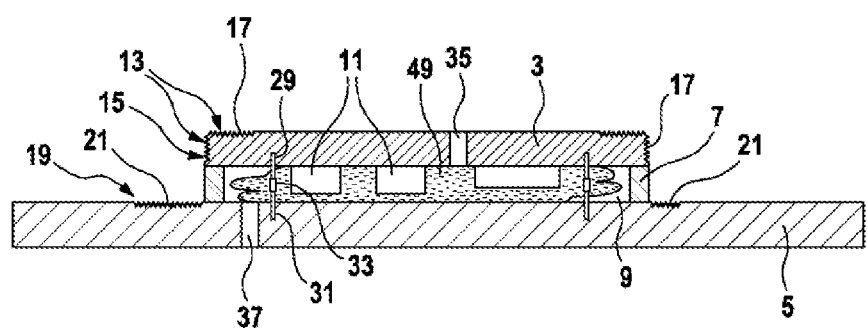
FIGS. 1(a), (b) illustrate a method for producing an electronic module and a finished electronic module according to one embodiment of the present invention.

An embodiment of an electronic module 1 according to the invention and of a method for the production thereof will be described with reference to FIGS. 1(a) and (b).

First, a first circuit board element 3 and a second circuit board element 5, as well as a spacer 7, are provided. The two circuit board elements 3, 5 consist of a thermosetting plastic, for example glass fiber-reinforced epoxy resin. The spacer 7 is arranged as a frame between the two circuit board elements 3, 5, which are arranged parallel to one another, so that the circuit board elements 3, 5 together with the annular spacer 7 fully enclose a central cavity 9. The spacer 7 is in this case dimensioned in relation to its thickness in such a way that the central cavity 9 offers sufficient space for electronic components 11, which are arranged on the first circuit board element 3 on a surface facing toward the central cavity 9.

Figure 2:
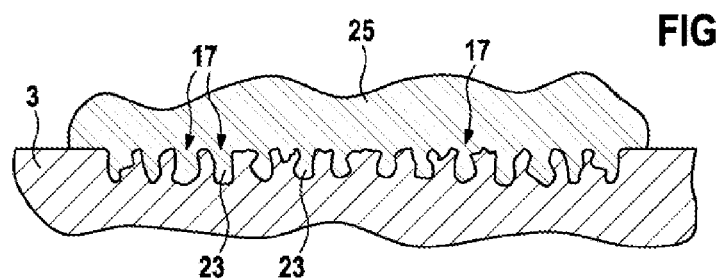
FIG. 2 illustrates in cross section a form-fit connection with the aid of microstructuring.

On an outwardly directed surface 13 of the first circuit board element 3, in the vicinity of the outer circumference 15 of this first circuit board element 3, microstructuring 17 is then formed, for example by laser texturing. Microstructuring 21 is also formed on an adjacent surface 19 of the second circuit board element 5. As represented in FIG. 2, the microstructurings 17, 21 comprise a multiplicity of microscopically small indentations 23 in the form of cavities or undercuts. These indentations generally have dimensions in the submicrometer range, and have for example a depth and/or width of between 10 and 500 nm.

The microstructurings 17, 21 provided on the circuit board elements 3, 5 can subsequently assist with hermetically sealed encapsulation of the two circuit board elements 3, 5 with one another. To this end, a plastic in the form of a subsequently curable liquid is applied, for example by injection molding, in the region of the outer circumference 15 of the first circuit board element 3, while extending around this circumference 15 in a ring. The liquid plastic flows at least partially into the indentations 23 of the microstructurings 17, 21. The spacer 7 in this case prevents the liquid plastic from flowing into the central cavity 9. After curing of the plastic, it forms the sealing ring 25. The plastic which has flowed into the indentations 23 and then been cured in this case forms a hermetically sealed form-fit connection between the sealing ring 25 and the respective surfaces 13, 19 of the first and second circuit board elements 3, 5.

Figure 1B:
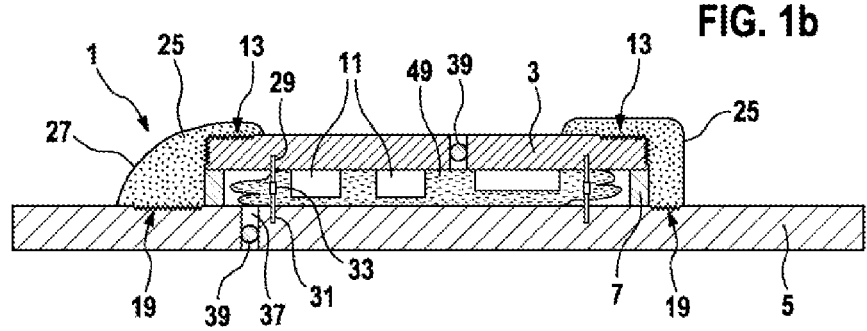

In FIG. 1(b), the sealing ring 25 is formed on the left-hand side in the shape of an injection-molded "caterpillar". The plastic applied in the liquid state merges onto the surfaces 13, 19 of the circuit board elements 3, 5 and flows into the microstructurings 17, 21. A shape of an outwardly exposed surface 27 is, however, formed randomly. On the right-hand side in FIG. 1(b), the sealing ring 25 has been applied with the aid of a tool, with the aid of which a cavity was initially formed adjacent to the surfaces 13, 19 to be connected, which was then filled with the liquid plastic for the sealing ring 25, the plastic subsequently having been cured so that a predeterminable external geometry can be produced for the sealing ring 25.

The electronic components 11 provided on the first circuit board element 3 are connected to first electrical terminals 29. On the second circuit board element 3, second electrical terminals 31 are provided, to which the electrical components 47 (not represented in FIG. 1, but see FIG. 4) provided on this second component 5 are electrically connected. By means of press-fit connections 33 or by means of spring contacts, the first electrical terminals 29 are electrically connected to the second electrical terminals 31. In this way, the electronic components 11 provided in the central cavity 9 can be electrically connected electrically to the electrical components 47 provided outside this central cavity 9.

In order to be able to dissipate heat given off during operation of the electronic components 11 better, the central cavity 9 may finally be filled with a thermally conductive gel 49 through an opening 35. The two circuit board elements 3, 5 may have thermal vias which conduct the heat from the components 11 to outer sides of the two circuit board elements 3, 5.

The filling opening 35 as well as a ventilation opening 37 in the two circuit board elements 3, 5 may finally be closed in a leaktight fashion, for example by a solder, adhesive or a pressed-in pin or a pressed-in ball 39.

Figure 3A:
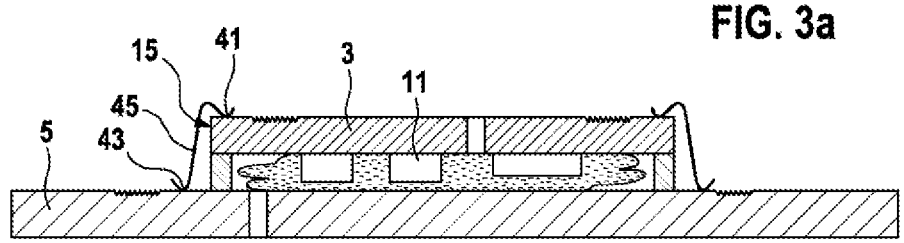
FIGS. 3(a), (b) illustrate a method for producing an electronic module and a finished electronic module according to an alternative embodiment of the present invention.
Figure 3B:
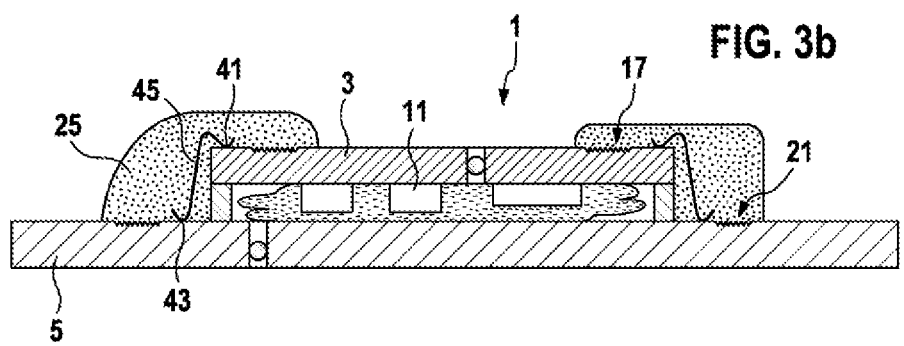

FIGS. 3(a) and 3(b) represent an alternative embodiment of an electronic module 1. In this embodiment, electrical connection between the electronic components 11 provided on the first circuit board element 3 and the electrical components 47 provided on the second circuit board element 5 is not carried out inside the central cavity 9. Instead, such an electrical connection between externally lying electrical terminals 41 on the first circuit board element 3 and likewise externally lying terminals 43 on the second circuit board element 5 is carried out via electrical lines 45. These electrical lines 45 may, for example, be provided in the form of a bonding wire, a ribbon cable or an SMD jumper. The electrical lines 45 may in this case be arranged close to the circumference of the first circuit board element 3 and subsequently be jointly encapsulated during the injection molding of liquid plastic around this circumference 15 in order to form the sealing ring 25. Such externally lying electrical lines 45, particularly in the form of bonds, may have the advantage over the press contacts represented in FIG. 1 that they function without bores in the circuit board elements 3, and therefore allow simpler preparation of the component parts. In the case of bores for press contacts, a through-hole should be avoided so that no external leaks are formed.

Figure 4:
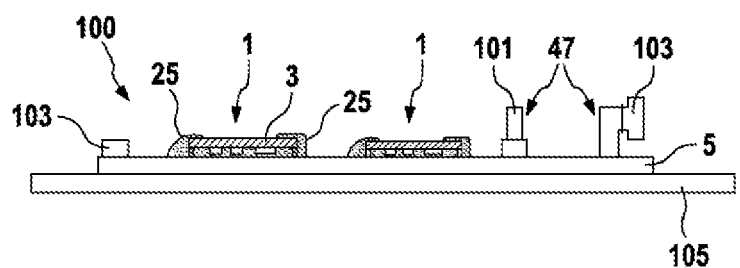
FIG. 4 illustrates an electronic module in a transmission control unit according to one embodiment of the present invention.

FIG. 4 illustrates a transmission control unit 100 having a plurality of electronic modules 1, an external sensor 101 used as an electrical component 47, and a plurality of jacks 103 likewise used as electrical components 47. The second circuit board element 5 in this case refers to the printed circuit board which undertakes interconnection of the electronics with electrical components 47 of an external circuit. In the transmission control unit 100, these are the sensor 101, the jack 103, further electronics and actuators, etc. The first circuit board element 3 may be a circuit board in the form of an HDI-PCB (high identity interconnect), a DBC (direct bonded copper), or a ceramic substrate (LTCC, HTCC, thick film, etc.), which form for example circuits for electronics of a transmission control unit. Primarily, how-ever, the inventive concept on which the present invention is based may be used in PCB-to-PCB sealing. A carrier plate 105 mechanically supports the electronic module 1.

Figure 5:
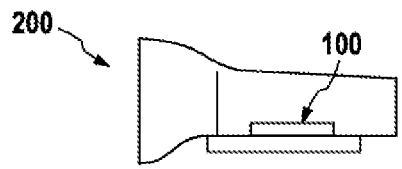
FIG. 5 illustrates a transmission having a transmission control unit.

FIG. 5 shows a vehicle transmission 200 having a transmission control unit 100 formed with the aid of an electronic module according to the invention. The described electronic modules may, however, also be used for other applications, for example in engines or at other places in the vehicle, for example in a fuel tank, cooling water, urea system, electrical drive, in the spray water area, etc.

The invention claimed is:

1. A method for producing an electronic module, comprising:
    providing a first circuit board element, a second circuit board element beneath the first circuit board element, and a spacer, the first circuit board element, the second circuit board element, and the spacer configured such that together they fully enclose a central cavity in which at least one electronic component of the first circuit board element is received;
    forming a first microstructuring in a shape of a first ring on an upwardly directed surface of the first circuit board element without microstructuring entire upwardly directed surface of the first circuit board element, forming a second microstructuring in a shape of a second ring on an outer circumference of the first circuit board element, and forming a third microstructuring in a shape of a third ring located outside of the cavity next to the spacer on an upwardly directed surface of the second circuit board element without microstructuring entire upwardly directed surface of the second circuit board element outside of the cavity;
    arranging the at least one electronic component on a surface of the first circuit board element facing toward the central cavity; and
    forming a sealing ring along the outer circumference of the first circuit board element such that the sealing ring is connected with a form fit to the first microstructuring and the second microstructuring formed on the first circuit board element and is connected with a form fit to the third microstructuring formed on the second circuit board element.

2. The method as claimed in claim 1, wherein forming the first microstructuring, the second microstructuring, and the third microstructuring includes at least one of laser structuring, chemical roughening, mechanical roughening and plasma roughening.

3. The method as claimed in claim 1, wherein forming the sealing ring includes at least one of thermoplastic injection molding, thermoset injection molding, adhesive bonding and filling with an encapsulation compound.

4. The method as claimed in claim 1, wherein forming the sealing ring includes forming the sealing ring without covering the entire upwardly directed surface of the first circuit board element with the sealing ring.

* * * * *